United States Patent [19]
Gerke et al.

[11] Patent Number: 4,973,262
[45] Date of Patent: Nov. 27, 1990

[54] CONDUCT MEMBER FOR ELECTRICAL CONDUCTORS

[75] Inventors: Dieter Gerke; Wilhelm Bramkamp; Gunter Hegner; Lutz Biederstedt, all of Berlin, Fed. Rep. of Germany; Robert A. Williams, Bateau Bay, Australia; Manfred Müller; Wolfgang Radelow, both of Berlin, Fed. Rep. of Germany

[73] Assignee: Krone Aktiengesellschaft, Berlin, Fed. Rep. of Germany

[21] Appl. No.: 389,854

[22] Filed: Aug. 4, 1989

[30] Foreign Application Priority Data

Sep. 22, 1988 [DE] Fed. Rep. of Germany ....... 3832497

[51] Int. Cl.$^5$ .............................................. H01R 4/24
[52] U.S. Cl. ................................................... 439/395
[58] Field of Search ................................. 439/389–425, 439/86, 87, 886, 492–499

[56] References Cited

U.S. PATENT DOCUMENTS 3,668,301  6/1972  Faulconer ......................... 439/392

Primary Examiner—Joseph H. McGlynn
Attorney, Agent, or Firm—McGlew and Tuttle

[57] ABSTRACT

A contact member for electrical conductors, in particular for cable wires of telecommunication systems, comprises two electrically conductive contact sections forming a contact slot, in order to simplify and make less costly manufacture and assembly of the components including the contact members, the contact section are formed from an insulating material and are provided with metallized contact surfaces.

28 Claims, 7 Drawing Sheets

CONDUCT MEMBER FOR ELECTRICAL CONDUCTORS

BACKGROUND OF THE INVENTION

Field of the Invention

The invention relates in general to communication system conductors and in particular to a new and useful contact member for electrical conductors made of an insulating material leaving a contact slot with a metallised connective system.

Contact members for electrical conductors are required particularly for components of telecommunication systems, as connector and disconnector banks, wire connectors, printed-circuit boards and the like. Herein, the contact member is composed usually of an electrically conducted metal material and is inserted into the component composed of an insulating material. As insulating materials for connector and disconnector banks as well as for wire connectors, commonly thermoboards plastics are used, and for printed-circuit boards, boards based on paper and impregnated in an artificial resin or glass-fibre reinforced artificial resins are used. It is disadvantageous, here, that usually two components are required, i.e. a base section of insulating material and the metal contact member inserted into the latter. Thereby, manufacture and assembly of the known contact members for electrical conductors are complicated and expensive.

SUMMARY OF THE INVENTION

The invention provides a contact member which is easy and economical to manufacture and which simplifies and makes less costly the components including the contact members.

According to the invention, the contact section of the contact member is formed from an insulating material, preferably from the insulating material of the component itself, and is provided with a metallised surface. Thus, in a simple and economical way, contact members for electrical wires can be produced, which are intended particularly for components of telecommunication systems. The contact member can in a preferred manner be formed as one piece together with the component from a common insulating material, the contact section being, thereafter, provided with a metallised surface.

The contact member according to the invention is particularly suitable for application with printed-circuit boards, for which the contact member according to the invention can be formed as one piece with the printed-circuit board. Further, the contact member according to the invention is advantageously employable for constructing wire connectors. Therein, a stripped conductor can be clamped-in between conically narrowing contact sections.

In a particularly preferred manner, the contact sections are provided with cutting edges forming the contact slot, the said cutting edges being formed from the insulating material and being provided with metallised surfaces which cut into the covering of a non-stripped conductor when pressed-in and thus establishing an electrical contact between the metallised surfaces and the conductor core.

Accordingly, it is an object of the invention to provide a communication system contact for conductors which have an insulating material cover which may be removed partially and which comprises first and second adjacent contact members made of insulating material and declining post portions having facing sides which define a contact slot therebetween and which have metallised surfaces which taper inwardly so as to provide a frictional engagement surface with the contact at a location in which the cover portion has been removed.

A further object of the invention is to provide a contact construction in which the spaced post elements have metallised surfaces which extend therebetween into a gradual inwardly extending V-shaped slot which receives a conductor and which may engage with a stripped away portion or extend into the insulated covering material of the conductor to engage with a contact portion thereof.

A further object of the invention is to provide a contact made of an insulating material having metallised surfaces which are simple in design, rugged in construction and economical to manufacture.

The various features of novelty which characterize the invention are pointed out with particularity in the claims annexed to and forming a part of this disclosure. For a better understanding of the invention, its operating advantages and specific objects obtained by its uses, reference is made to the accompanying drawings and descriptive matter in which preferred embodiments of the invention are illustrated.

DETAILED DESCRIPTION OF THE DRAWINGS

Figure 1:
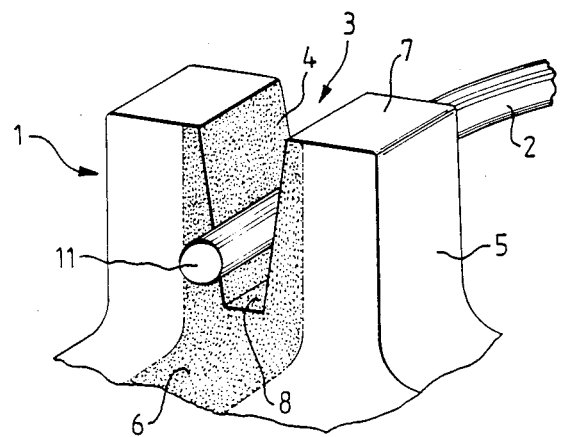
FIG. 1 is a perspective representation of contact member of a first embodiment of the invention.
Figure 2:
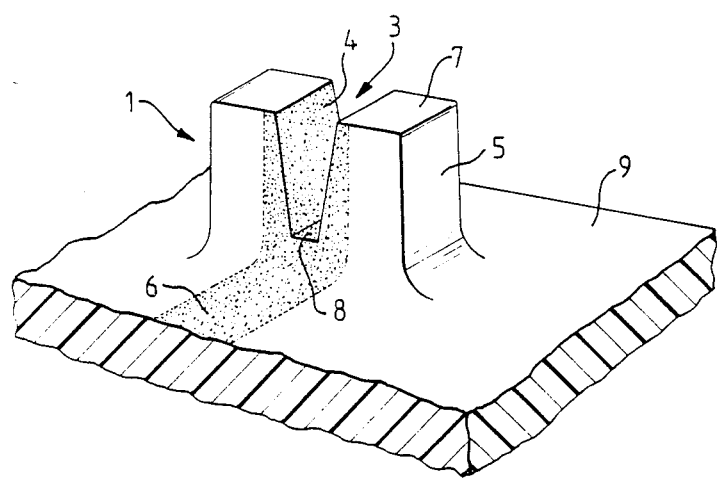
FIG. 2 is a perspective representation of a contact member formed from a printed-circuit board in the first embodiment.
Figure 3:
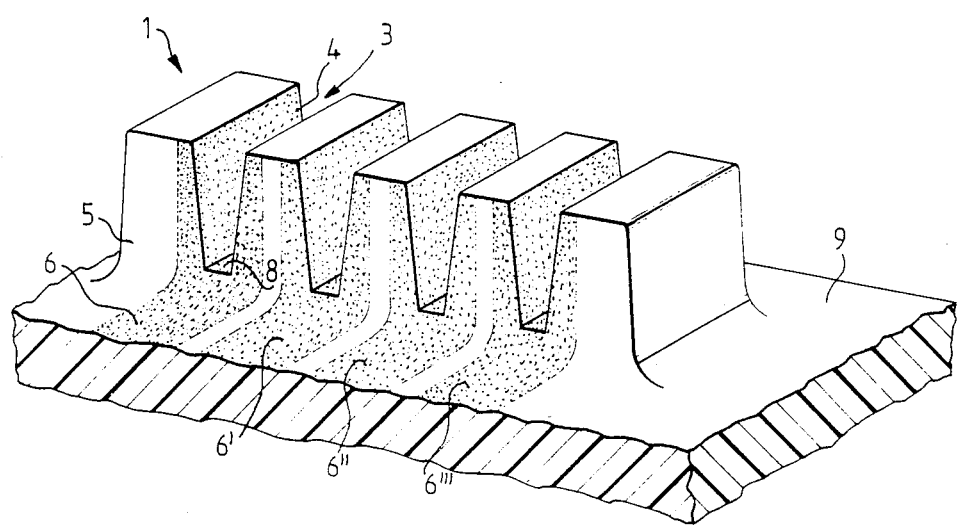
FIG. 3 is a perspective representation of several contact members arranged side-by-side and formed from a printed-circuit board in the first embodiment.

As shown in FIGS. 1 to 3, a contact member 1 for electrical conductors 2, in particular for cable wires of telecommunication systems, comprises two electrically conductive contact sections or post portions 4 and 4' having facing sides which define a contact slot 3 therebetween. The contact sections 4 and 4' are formed from an insulating material 5 and are provided with metallised areas or surfaces 6. The insulating material 5 is formed to block-shaped elevations 7, between which the V-shaped contact slot 3 is disposed, the base 8 of which is flattened. The side faces of the V-shaped contact slot 3 and the adjacent sections of the elevations 7 are provided with the metal surfaces 6 formed on the contact sections 4 and 4'. The metallised surfaces 6 are generated by vapor-deposition or electrolytical deposition of conductive metal material on the surfaces of the insulating material 5.

As shown in FIG. 1, the conductor core 11 of the conductor 2 is stripped and is clamped-in between the conically narrowing V-shaped contact slot 3. Thereby, an electrical contact connection is established between the conductor core 11 and the metal surface 6, which is guided to a conductor section point in a manner not shown in greater detail.

According to FIG. 2, there are elevations 7 on a carrier element 9, which may be formed by a printed-circuit board. According to FIG. 3, there are several contact section 4, 4' each including a contact slot 3 therebetween arranged side-by-side on a carrier element 9. The contact section 4, 4'etc. of adjacent contact slots 3 are provided with metallised surfaces 6, 6', 6", 6''' which are electrically separated from one another. This contact member 1, too, may be arranged on a printed-circuit board formed by the carrier element 9. The elevations 7 of the carrier element 9 representing the printed-circuit board are formed as one piece together with the carrier element 9.

Figure 4:
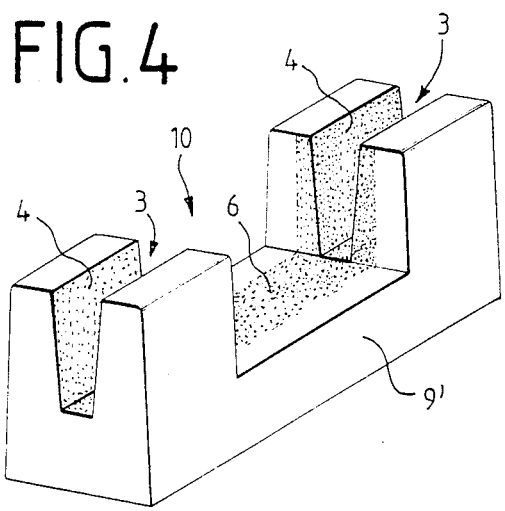
FIG. 4 is a perspective representation of two contact members constructing a wire connector in the first embodiment.

According to FIG. 4, two pairs 10 of a contact sections 4, 4' including a contact slot 3 therebetween are disposed on a carrier element 9' and are provided with metallised surfaces 6 being electrically connected with one another for forming a wire connector (FIG. 4).

The contact members described up to now of the first embodiment require stripping the conductors 2 to the conductor core 11 free. The conductor core 11 is clamped-in into the contact slot 3 of the contact members 1. There, the side faces of the contact slot 3 could hold the conductor core 11 by frictional contact. On the other hand, a soldering action between the conductor core 11 and the metallised contact section 4 could be effected, too. Application of the contact member 1 described heretofore is effected substantially for printed-circuit boards being formed from plastic. Simultaneously elevations or blocks 7 may be formed. The metallised surface 6 are produced by electroplating or the like and can be produced together with the formation of the electrical connections on the printed-circuit board.

The embodiments of the contact member described in the following do not require any stripping of the conductor 2, but form insulation displacement contacts, to which the conductors 2 can be connected without stripping. Thus, e.g., in the second embodiment according to FIGS. 5 to 8, opposed cutting edges 13 are formed in the insulating material 15 and are provided with metallised surfaces 16 for cutting into the covering 12 of the conductors 2. The cutting edges 13 have a triangular shape and are formed as one piece together with the insulating material 15 of the carrier element 19 forming the contact member. As the triangularly shaped cutting edges 13 are formed as one piece from the insulating material 15 of the contact member, the cutting edges 13 can be designed as inexpensive spring-loaded members. For forming a desired admissible spring deflection of the cutting edges 13, these can also be formed from cut-free, triangularly shaped plastic pieces, In either case, it must be made sure that the triangularly shaped cutting edges 13 abut, after cutting into the covering 12 of the conductor 2, against the conductor core 11 in a clamping/spring-type manner. The metallised surfaces 16 come, thereby, into contact with the conductor core 11, such that an electrical contact connection can be established.

Figure 5:
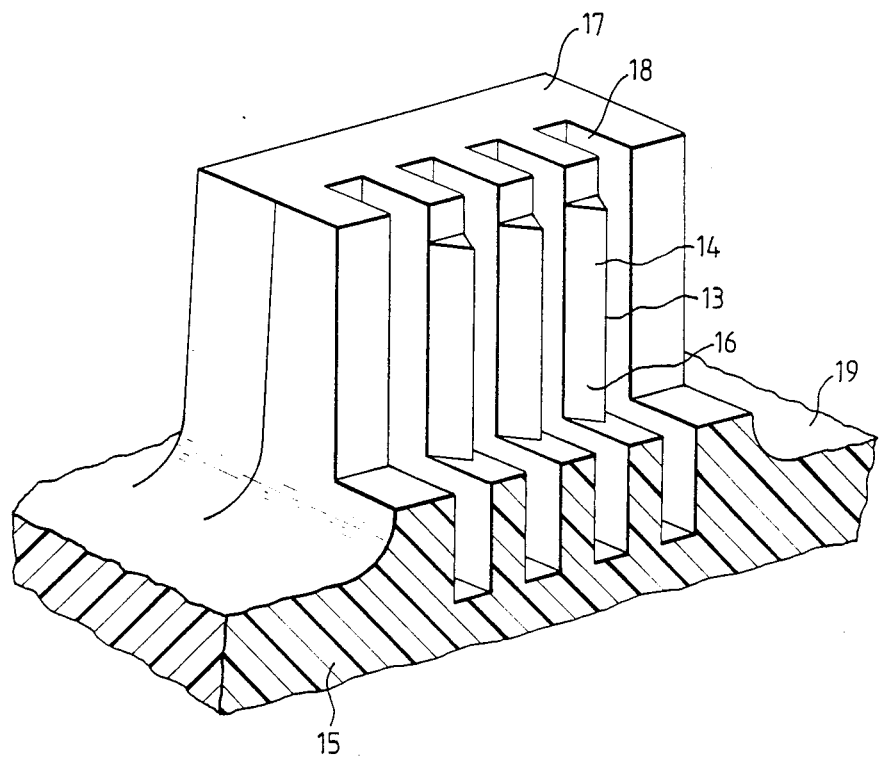
FIG. 5 is a longitudinal section through a contact member formed from a printed-circuit board in a second embodiment of the invention.

As shown in FIG. 5, there is a free space 18 in the elevations 17 between the cutting edges 13. The elevations 17 are formed as one piece from the insulating material 15 of the carrier element 19.

Figure 6:
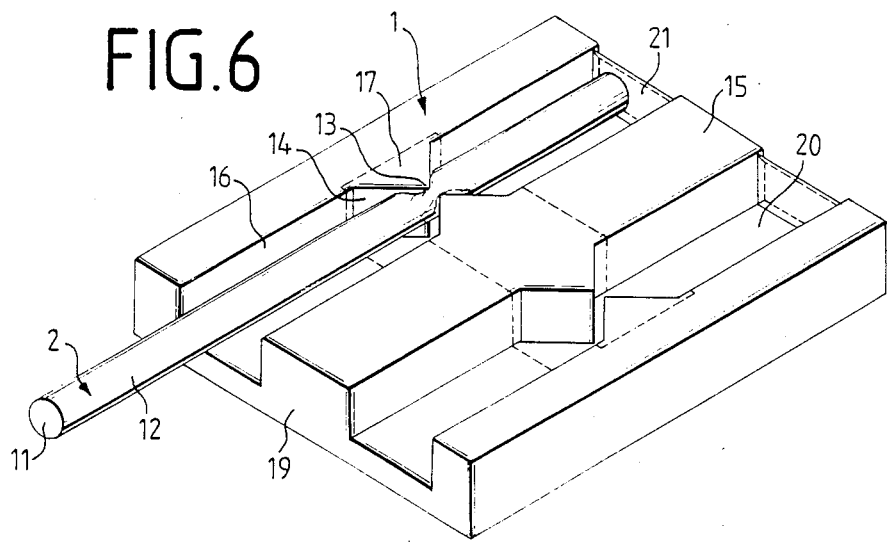
FIG. 6 and 7 are a perspective representation of the members according to the second embodiment.

As shown in FIG. 6, the opposed cutting edges 13 forming the contact sections 14 are formed within channels 20 provided in the insulating material 15, into each of the channels one conductor 2 is inserted. The metallised surfaces 16 of both channels 20 are electrically connected with one another, such that, thus, a wire connector is produced. At the free ends of the channels 20, cutting knives 21 are inserted, which separate simultaneously the conductors 2 when pressed-in into the cutting edges 13 by means of a tool (not shown).

Figure 7:
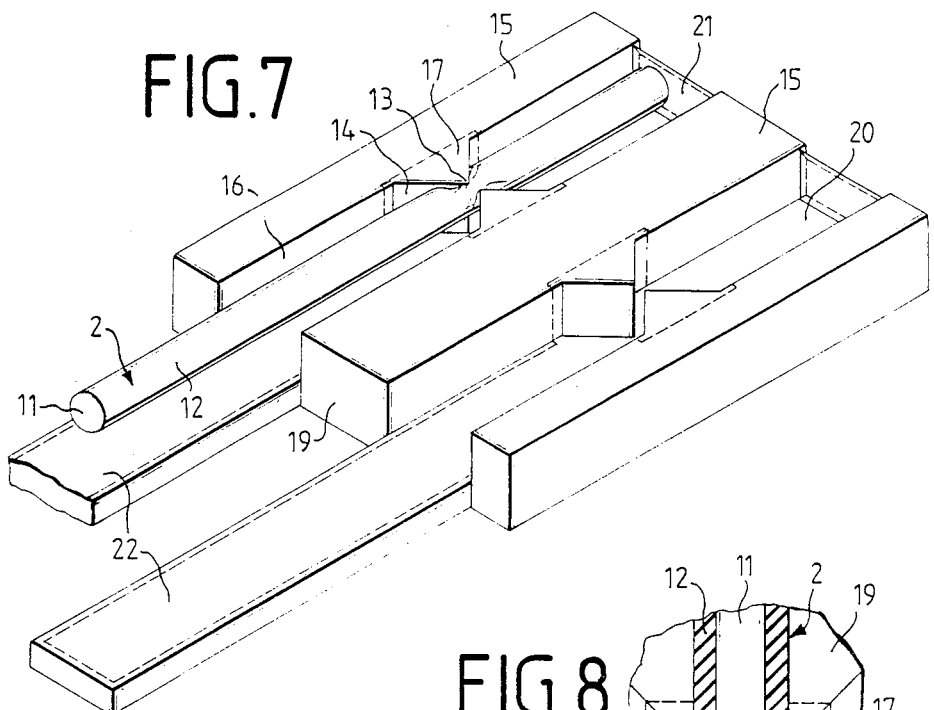

According to FIG. 7, connector tongues 22 can additionally be provided from the insulating material 15 of the contact member.

Figure 8:
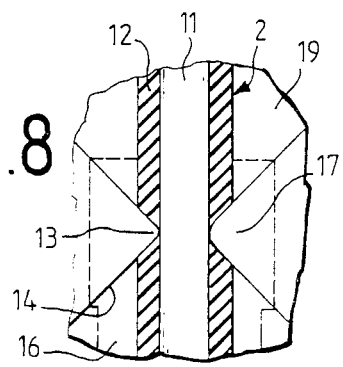
FIG. 8 is a detail of the contact member of the second embodiment according to FIGS. 6 and 7.
Figure 9:
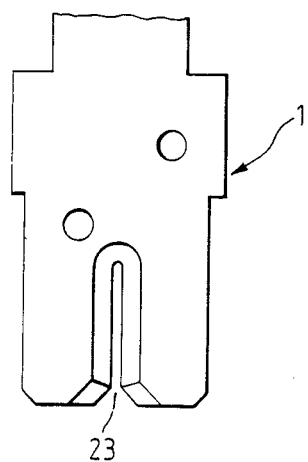
FIG. 9 is a top view of a contact member of a third embodiment of the invention.
Figure 11:
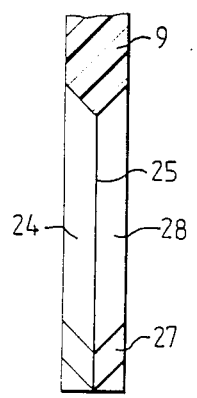
FIG. 11 is a longitudinal section through the contact slot of the contact member according to FIG. 10.
Figure 10:
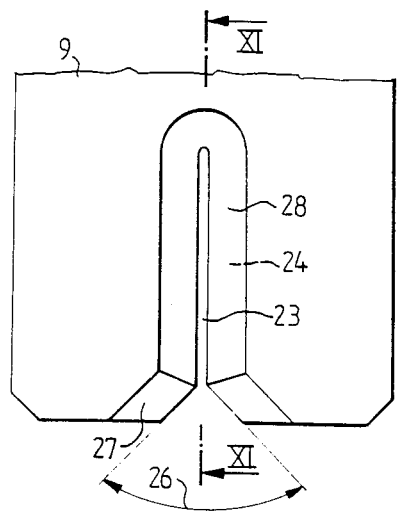
FIG. 10 is an enlarged detail of a contact member according to FIG. 9.
Figure 12:
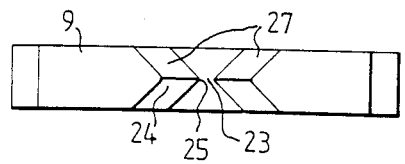
FIG. 12 is a top view on the contact slot of the contact member according to FIG. 10.
Figure 13:
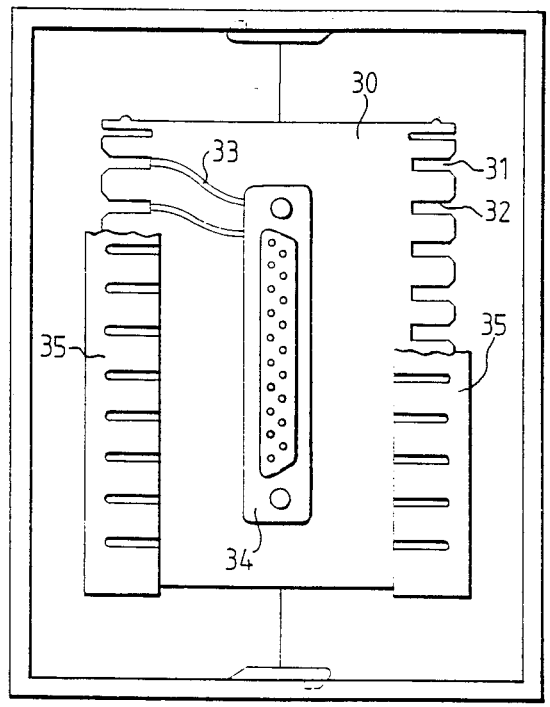
FIG. 13 is a top view on a connector socket of telecommunication systems with a built-in printed-circuit board having contact members according to a fourth embodiment.
Figure 15:
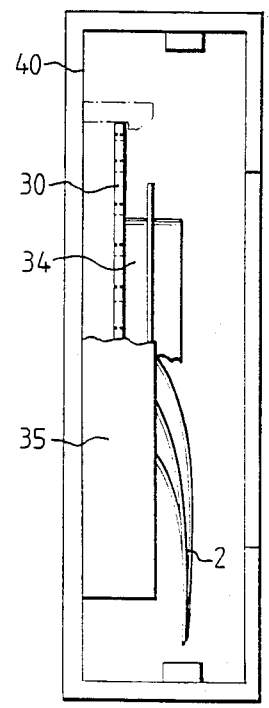
FIG. 15 is a longitudinal section through the connector socket according to FIG. 13.

FIG. 8 shows an enlarged detail of two opposed cutting edges 13, which are in electrical contact by their metallised surfaces 16 with the conductor core 2' when cutting into the covering 12 of the conductor 2.

According to the third embodiment represented in FIGS. 9 to 12, the contact section 24, 24' formed as metallised edges 25 of the contact member. To the edges 25, pre-edges 27 arranged under a V-shaped aperture angle 26 are assigned. The contact member according to the third embodiment is intended for insertion into the plastic bodies of connector and disconnector banks or plugs or can be formed as one piece together with the plugs. The contact sections 24 of the edges 25 are provided with metallised surfaces 28. These are guided to a non-shown terminal point. A contact member according to the third embodiments can also comprise two or more contact slots 23, the contact sections 24 of which are connected to one another over common metallised surfaces 28.

The fourth embodiment of the contact member shown in the FIGS. 13 to 16 comprises a printed-circuit board 30, in the two border sections of which clamping slots 31 are provided in combtype manner, the clamping slots having a rectangular cross-section. At least the interior portion of the clamping slot 31 is provided with a metallised surface 32 connected over electrical connections 33 with the individual contacts of a plug 34 being mounted centrally on the printed-circuit board 30. On each of the two border sections of the printed-circuit board 30, one U-shaped locking member 35 is plugged-on, which is provided with slots 38 staggered relative to each other in both legs 36, 37. The V-shaped locking members 35 can be latched on the border sections of the printed-circuit board 30, thus allowing an insulation displacement contact of the conductors 2. The covering 12 of the conductors 2 are cut-in by the edges of the clamping slots 31 such that their metallised surface 32 comes into conductive contact with the core 2' of the conductors 2.

Figure 16:
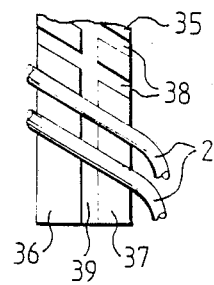
FIG. 16 is a top view on the front side of the locking member for the printed-circuit board of the connector socket according to FIG. 13.

FIG. 16 shows a top view on a U-shaped locking member 35 with obliquely extending slots 38 in the two legs 36, 37 limiting the interior longitudinal slot 39. Into the slots 38, the non-stripped conductors 2 are inserted, these being arranged, thus, under an angle relative to the longitudinal slot 39, which is plugged on the border sections of the printed-circuit board 30 provided with clamping slots 31, thus an insulation displacement contact is effected.

Figure 14:
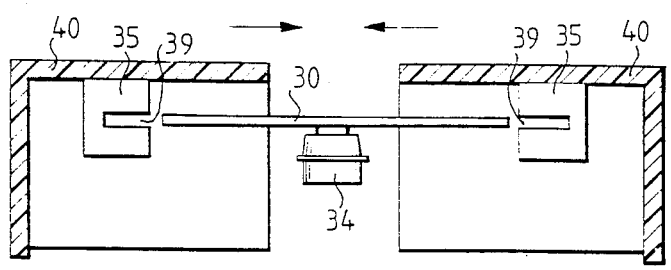
FIG. 14 is a cross-section through the connector socket according to FIG. 13 with opened-up halves of the housing.

FIG. 14 shows the arrangement of the U-shaped locking members 35 within two half-shells 40 of the housing, which are constructed such that the housing formed by the two half-shells 40 is closed, when the locking members 35 are slid upon the border sections of the printed-circuit board 30.

Figure 17:
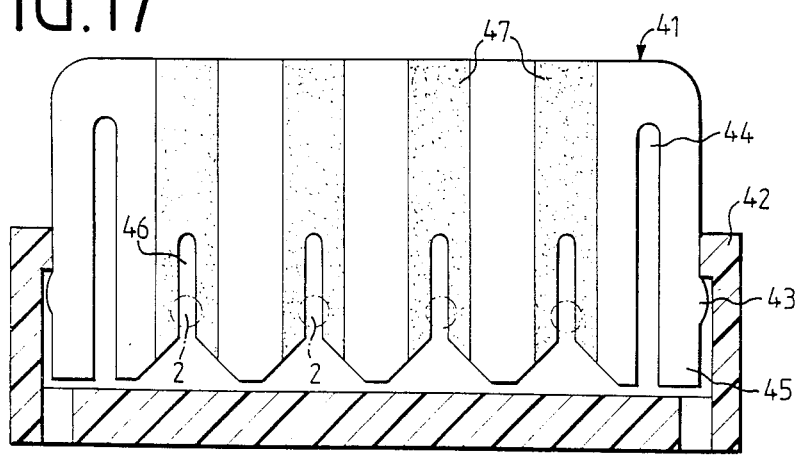
FIG. 17 is a longitudinal section through a contact member of a fifth embodiment.
Figure 18:
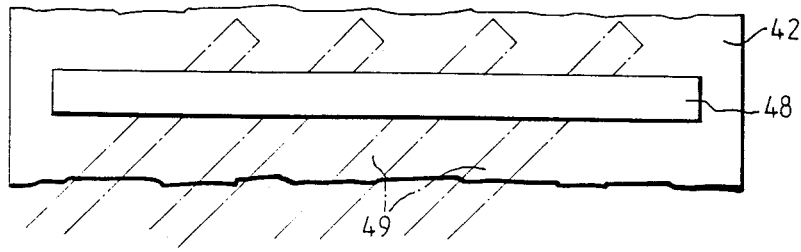
FIG. 18 is a top view on the locking member of the contact member according to FIG. 17.

FIGS. 17 and 18 show as fifth embodiment a contact member being formed from a comb-type printed-circuit board 41 and from a locking member 42 being plugged on the free border section of the printed-circuit board 41 and being locked behind latches 43 of the printed-circuit board 41. For generating a spring action, the printed-circuit board 41 is provided in the area of the latches 43 with longitudinal slots 44 being parallel at the borders, such that the outside legs 45 being, thus, cut free, of the printed-circuit board 41 are formed in spring-type manner.

Between the outside longitudinal slots 44, additional contact slots 46 are provided in the printed-circuit board 41 which provided with metallised surfaces 47 extending into the contact slots 46.

The locking member 42 is provided with a longitudinal slot 48 and with lateral boreholes 49 arranged under an angle relative hereto, the conductors 2 are inserted into the lateral boreholes 49. By pressing the printed-circuit board 41 into the locking member 42, the coverings 12 of the conductors 2 are cut-in by the edges of the contact slots 46, thus an electrical contact between the conductor cores 11 and the metallised surfaces of the printed-circuit board 41 are established. Instead of the lateral boreholes 49, grooves can be provided for inserting the conductors 2.

The sixth embodiment of the contact member shown in FIG. 19 to 22 comprises a printed-circuit board 50 with a borehole 51 provided with metallised surfaces 52. For pressing a conductor 2 into the borehole 51, a pushbutton-type locking element 54 is provided comprising a pressure surface 53, a receiving groove 55 on the front side opposed to the pressure surface 53, and latches 56, the distance of which to the edge of the pressure surface 54 corresponding approximately to the thickness of the printed-circuit-board 50.

Figure 19:
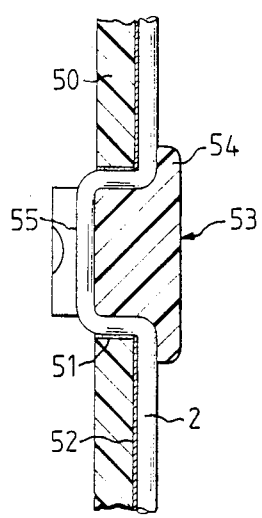
FIG. 19 is a cross-section through a printed-circuit board with a contact member according to a sixth embodiment.
Figure 20:
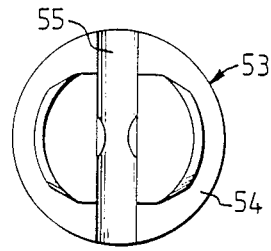
FIG. 20 is a bottom view of a pressure piece of the contact member according to FIG. 19.
Figure 21:
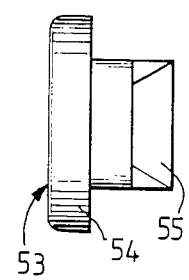
FIG. 21 and 22 are side views of the pressure piece according to FIG. 20.
Figure 22:
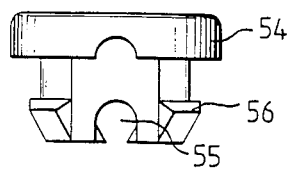

Into the receiving groove 55 of the pushbutton-type locking member 53, a non-stripped conductor 2 is inserted and is pressed-in by application on the pressure surface 53 into the borehole 51, as shown in FIG. 19. Thereby, the conductor 2 is deformed in a U-shaped manner, the sharp edges of the borehole 51 cutting into the conductor core 11, and the metallised surface 52 being brought into electrical contact with the conductor core 11. The latches 56 engage, when emerging from the borehole 51, behind the rear side of the printed-circuit board 50, thus the contact connection is secured.

While specific embodiments of the invention have been shown and described in detail to illustrate the application of the principles of the invention, it will be understood that the invention may be embodied otherwise without departing from such principles.

What is claimed is:

1. A communication system contact for conductors having an insulating material cover which may be removed, comprising first and second adjacent contact members made of insulating material and defining first and second spaced apart post portions having facing sides which define a contact slot therebetween open on at least one side, said facing sides having a metallized material surface tapering inwardly and defining a frictional engagement area therebetween for an uncovered portion of the contact.

2. A communication system contact according to claim 1, wherein said metallised material surfaces extend together out of said contact slot.

3. A communication system contact according to claim 1, wherein said system contact comprises a plurality of sets of first and second post portions each having metallised surfaces which interconnect and extend out of said slots.

4. A communication system contact according to claim 1, including a carrier comprising a board of insulating material from which said posts project.

5. A communication system contact according to claim 1, including at least three side by side post portions with a slot defined between each adjacent two post portions.

6. A communication system according to claim 1, including two sets of spaced apart post portions each set having interconnecting metallised surfaces and which are interconnected by a metallised surface.

7. A communication system contact according to claim 1, including a plurality of side by side posts in addition to said first and second post arranged in parallel vertical rows.

8. A communication system contact according to claim 1, wherein said metallised material surfaces comprise a pair of the post metal plates arranged on respective first and second posts and providing contact covering material piercing elements which engage into the contact.

9. A communication system contact according to claims 1, wherein said posts are formed on a single carrier and have opposed metallised contact cutting edges.

10. A communication system contact member according to claim 1, wherein said contact members are provided at contact legs formed within a clamping slot between a clamping piece for the conductors.

11. A contact system contact according to claim 1, including a printed-circuit board containing said post portions, said printed-circuit board being formed integral with said post portions and being made of an insulating material such as plastic.

12. A communication system contact according to claim 1, wherein said contact edges comprise metallised material edges of substantially V-shaped cross section.

13. A communication system contact according to claim 1, including a comb-type chord element containing said posts along an edge thereof and including a U-shape locking member having slots staggered relative to each other on each side of said locking member said locking member being latchable on a border section of said printed circuit board and allowing an insulation displacement contact of the conductors.

14. A communication system contact according to claim 1, including a printed circuit-board containing said posts, said posts being arranged along an edge of said board and including a locking member having a slot of a size to receive an edge of said circuit-board.

15. A communication system contact according to claim 14, wherein said printed circuit-board includes opposite edges containing a plurality of spaced apart posts which every adjacent two of them defining a slot therebetween for the clamping engagement of a contact in said slot and including a housing having two housing shell portions engageable over said printed circuit-board from each edge thereof said locking members fixed thereon locking said board with the contact members in position.

16. A communication system contact according to claim 14, including a printed circuit member having a plurality of first and second posts arranged in a row and including a locking member engaging over the edge of said printed circuit-board having said slots and means defining a locking projection and recess between said locking member and said printed circuit-board when they are interengaged.

17. A communication system contact according to claim 14, including a plug carried on said printed circuit-board having a plurality of contact terminals, said metallised surfaces extending over said printed circuit-board from a respective slot to a respective terminal.

18. A communication system contact according to claim 17, wherein said locking member includes an axial slot extending along its edge and cross slots intersecting said axial slot for the placement of conductor wires therein.

19. A communication system contact according to claim 1, wherein said metallised surfaces defined cutting edges having a triangular shape.

20. A contact member according to claim 19 including a printed circuit board said at least one contact section includes a section portion disposed at an elevation in said printed circuit board said board and said section being constructed as one piece.

21. A contact member according to claim 19, wherein said contact section includes a member provided with a conically narrowing contact slot of a size to receive stripped cable wires.

22. A contact member according to claim 21, wherein said contact section comprises a carrier, several contact section portions each including a contact slot and arranged side by side on said carrier, said contact section of adjacent contact slots being provided with respective metallised surfaces which are separated from one another.

23. A communication system contact according to claim 19, wherein said cutting edges are spring suspended.

24. A communication system contact member according to claim 23, wherein said spring suspended cutting edges are constructed from angular pieces being formed in said insulating material.

25. A contact member according to claim 21, wherein two pairs of contact sections each include a contact slot and including a carrier element on which said contact sections are disposed and said metallised surfaces being connected with one another for forming a wire connector.

26. A contact member according to claim 25, wherein said carrier element and said contact sections are made of insulating material said insulating material having opposed cutting edges provided with metallised surfaces in forming said contact receiving slot.

27. A contact member for an electrical wire conductor comprising:
an insulating material having a contact section defining an electrical wire conductor receiving slot with a conductor access opening on at least one longitudinal end, the slot of said insulating material having inwardly and downwardly sloping sides forming an engagement for electrical wire conductor; a metallized surface on at least a portion of the slot of said insulating material and forming a connecting electrical conduit away from the slot.

28. A contact member for electrical wire conductors according to claim 27, wherein:
said insulating material is a board and the slot of said insulating material extends into said board;
a push-button type locking element insertable into the slot having an insertable end with locking tabs and an outer end having a skirt portion overlying a portion of said board around said slot, said insertable end having an inner face forming a channel for engaging the electrical wire conductor.

* * * * *